United States Patent
Chia et al.

(10) Patent No.: US 7,327,043 B2
(45) Date of Patent: Feb. 5, 2008

(54) TWO LAYER SUBSTRATE BALL GRID ARRAY DESIGN

(75) Inventors: Chok J. Chia, Cupertino, CA (US); Allen Seng Sooi Lim, San Jose, CA (US); Maurice O. Othieno, Union City, CA (US)

(73) Assignee: LSI Logic Corporation, Milpitas, CA (US)

( * ) Notice: Subject to any disclaimer, the term of this patent is extended or adjusted under 35 U.S.C. 154(b) by 358 days.

(21) Appl. No.: 11/205,364

(22) Filed: Aug. 17, 2005

(65) Prior Publication Data
US 2007/0040284 A1    Feb. 22, 2007

(51) Int. Cl.
*H01L 23/48* (2006.01)
*H01L 23/52* (2006.01)
*H01L 29/40* (2006.01)

(52) U.S. Cl. ................................ 257/786; 257/784

(58) Field of Classification Search ............... 257/786, 257/784, 666, 698, 691
See application file for complete search history.

(56) References Cited

U.S. PATENT DOCUMENTS

| | | | |
|---|---|---|---|
| 6,707,164 B2* | 3/2004 | Cheng et al. | 257/786 |
| 6,956,286 B2* | 10/2005 | Kuzawinski et al. | 257/700 |
| 6,979,897 B2* | 12/2005 | Ma | 257/691 |
| 7,098,528 B2* | 8/2006 | Vasishta et al. | 257/668 |
| 7,202,559 B2* | 4/2007 | Zhao et al. | 257/707 |
| 2004/0097017 A1* | 5/2004 | Shimanuki | 438/124 |
| 2007/0004092 A1* | 1/2007 | Suzuki et al. | 438/123 |
| 2007/0018291 A1* | 1/2007 | Huang et al. | 257/676 |

\* cited by examiner

*Primary Examiner*—S. V. Clark
(74) *Attorney, Agent, or Firm*—Luedeka Neely & Graham, P.C.

(57) ABSTRACT

A routing pattern for high speed signals for a package substrate. Electrically conductive bond fingers are disposed on a first surface of the package substrate. The first surface is adapted to receive an integrated circuit in an attachment zone, and the bond fingers are disposed in at least two substantially concentric rings around the attachment zone. The bond fingers of the innermost ring of bond fingers are all routed to electrically conductive first traces disposed on a first layer of the package substrate. The bond fingers other that those on the innermost ring of bond fingers are all routed to electrically conductive second traces disposed on a separate second layer of the package substrate. The package substrate has electrically conductive traces on only the first layer and the second layer. Electrically conductive contacts are disposed on a substantially opposing second surface. The first traces are all routed to a first set of the contacts that are all disposed within an innermost portion of the second surface, and the second traces are all routed to a second set of the contacts that are all disposed within an outermost portion of the second surface.

12 Claims, 2 Drawing Sheets

TWO LAYER SUBSTRATE BALL GRID ARRAY DESIGN

FIELD

This invention relates to the field of integrated circuit fabrication. More particularly, this invention relates to package substrate designs for integrated circuits.

BACKGROUND

Integrated circuits are operating at ever increasing speeds. For example, integrated circuits for markets such as communication and storage are often embedded with multiple cores that send and receive signals at speeds greater than about two and one-half gigabits per second. Signal speeds above about one gigabit per second are defined herein to be a high speed signal.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar.

Integrated circuits are typically formed into packaged devices with a package substrate. The package substrate provides all of the electrical connections to the integrated circuit, and provides separate electrical connections to another structure, typically referred to as the printed circuit board. Thus, as the terms are used herein, there are three different structure types used in an electrical circuit, which structures are the integrated circuit, the printed circuit board, and the interface between the integrated circuit and the printed circuit board, which is the package substrate. As contemplated herein, the integrated circuit does not at any time physically contact the printed circuit board, and the printed circuit board and the package substrate are physically separate elements that are manufactured at different times and using different processes.

The distinction between the printed circuit board and the package substrate is further exemplified by the time at which they are electrically connected to the integrated circuit. The package substrate is considered to be a part of the packaged integrated circuit, and the integrated circuit is typically not shipped from the integrated circuit manufacturer until it is assembled as a packaged device with the package substrate. However, the packaged substrate is typically assembled with the printed circuit board in a different facility at a later time by a purchaser of the packed integrated circuit. Thus, one skilled in the art is able to quickly distinguish between a printed circuit board and a package substrate.

The typical construction and routing used by current technology package substrates tends to be unable to adequately handle the high speed signals used by some integrated circuit applications. What is needed, therefore, is a system of routing high speed signals in a manner that overcomes the problems and achieves the goals, such as those described above, at least in part.

SUMMARY

The above and other needs are met by a routing pattern for high speed signals for a package substrate. Electrically conductive bond fingers are disposed on a first surface of the package substrate. The first surface is adapted to receive an integrated circuit in an attachment zone, and the bond fingers are disposed in at least two substantially concentric rings around the attachment zone. The bond fingers of the innermost ring of bond fingers are all routed to electrically conductive first traces disposed on a first layer of the package substrate. The bond fingers other than those on the innermost ring of bond fingers are all routed to electrically conductive second traces disposed on a separate second layer of the package substrate. The package substrate has electrically conductive signal traces on only the first layer and the second layer. Electrically conductive contacts are disposed on a substantially opposing second surface. The first traces are all routed to a first set of the contacts that are all disposed within an innermost portion of the second surface, and the second traces are all routed to a second set of the contacts that are all disposed within an outermost portion of the second surface.

In this manner, all of the signals, both high speed signals and lower speed signals, can be routed on a package substrate that has no more than two routing layers. Preferably, all of the high speed signals are routed through the innermost ring of bond fingers, to the more interior contacts on the other side of the package substrate, and all of the low speed signals are routed through the outer rings of bond fingers, to the more peripheral contacts on the other side of the package substrate. In this manner, the high speed signals are routed on the shortest and most directly routed traces, and are not routed near lower speed signal traces, which tends to reduce interference, such as switching signal noise.

In various embodiments, none of the first traces are separated by non signal carrying traces, which are often referred to as guard traces. Similarly, in some embodiments, none of the second traces are separated by non signal carrying traces. In one embodiment a third set of contacts for power and ground only (not for any signals) is disposed interior to the first set of contacts on the second surface. Thus, the descriptor "innermost" in regard to the first set of contacts is only in regard to other sets of contacts for signals, such as the low speed signals. The first set of contacts may be disposed in a substantially concentric ring on the second surface. The second set of contacts may be disposed in at least one substantially concentric ring at a peripheral edge of the second surface.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
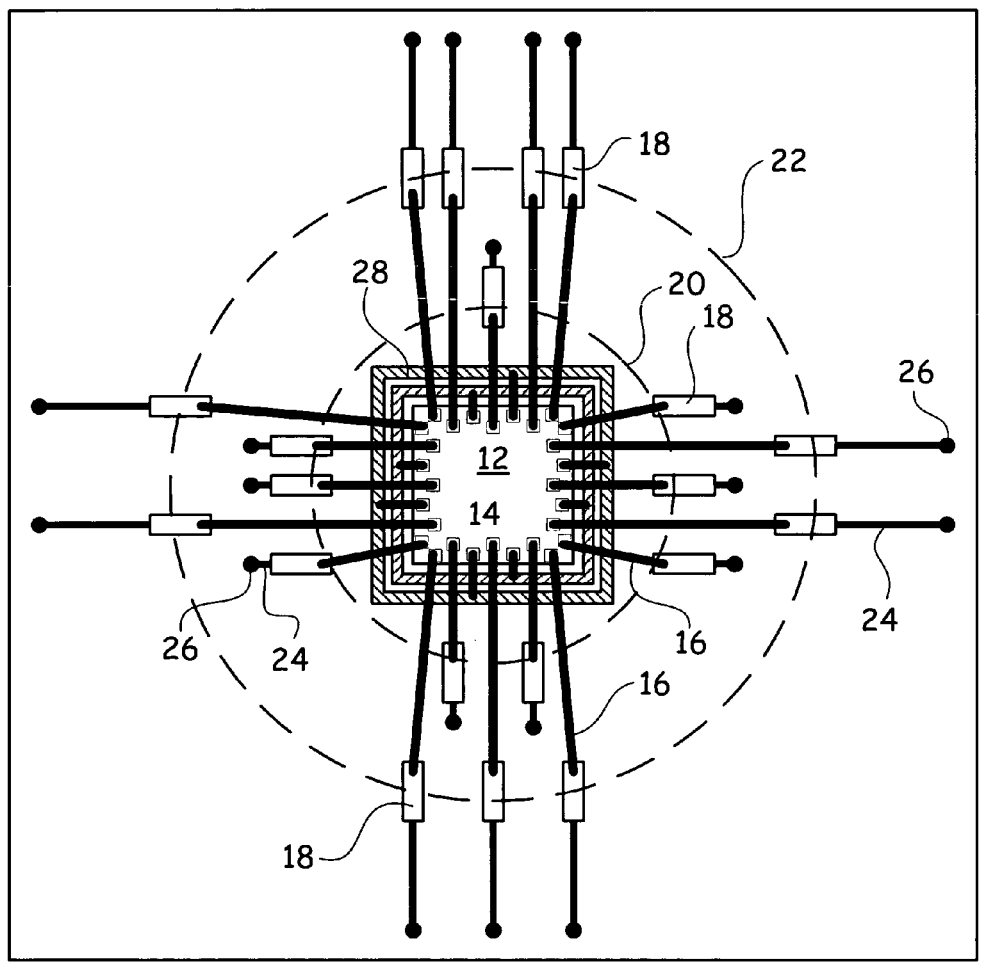
FIG. 1 is a top plan view of a package substrate design according to a preferred embodiment of the present invention.

With reference now to FIG. 1, there is depicted a top plan view of a package substrate 10 with a routing design according to a preferred embodiment of the present invention. An integrated circuit 12 is preferably attached in an attachment area to the package substrate 10, such as with an epoxy. Typically, the attachment area is in a central, interior portion of the package substrate 10. The integrated circuit 12 has bonding pads 14, through which electrical connections are made between the integrated circuit 12 and the package substrate 10, such as through wire bonds 16. The present invention is most preferably adapted for use with wire bonded integrated circuits 12. However, in various embodiments the invention can be adapted to bump bonded integrated circuits 12.

Electrical connections for power and ground for the integrated circuit 12 are preferable made to ring contacts 28, which are most preferably common contacts, one for the power connections and one for the ground connections. One set of signal connections is made to bond fingers 18 that are disposed in an innermost, substantially concentric ring 20 of bond fingers 18. Other bond fingers 18 are disposed in outer rings 22 of bond fingers 18. The rings 20 and 22 of bond fingers 18 are preferably not contiguous rings of bond fingers 18. Rather, the two rings 20 and 22, or more rings if such are desired, are formed by bringing some of the bond fingers 18 from the adjacent ring 22 closer in toward the integrated circuit 12 to form the innermost ring 20. Thus, there preferably are gaps between the bond fingers 18 in the innermost ring 20, and there also may be gaps between the bond fingers 18 of the next adjacent ring 22.

Most preferably, all of the high speed signals, as described above, are routed off the integrated circuit 12 through the innermost ring 20 of bond fingers 18. Thus, the high speed signals are preferably separated in this manner from the routing of the lower speed signals. Electrically conductive traces 24 are used to route the signals to electrically conductive vias 26, which route the signals to other layers on the package substrate 10. Preferably, the traces 24 that are used to route the high speed signals on the upper layer 34 are shorter than those used to route the low speed signals. This is by design, so that the signal routes for the high speed signals are shorter than those routes for the low speed signals.

Figure 2:
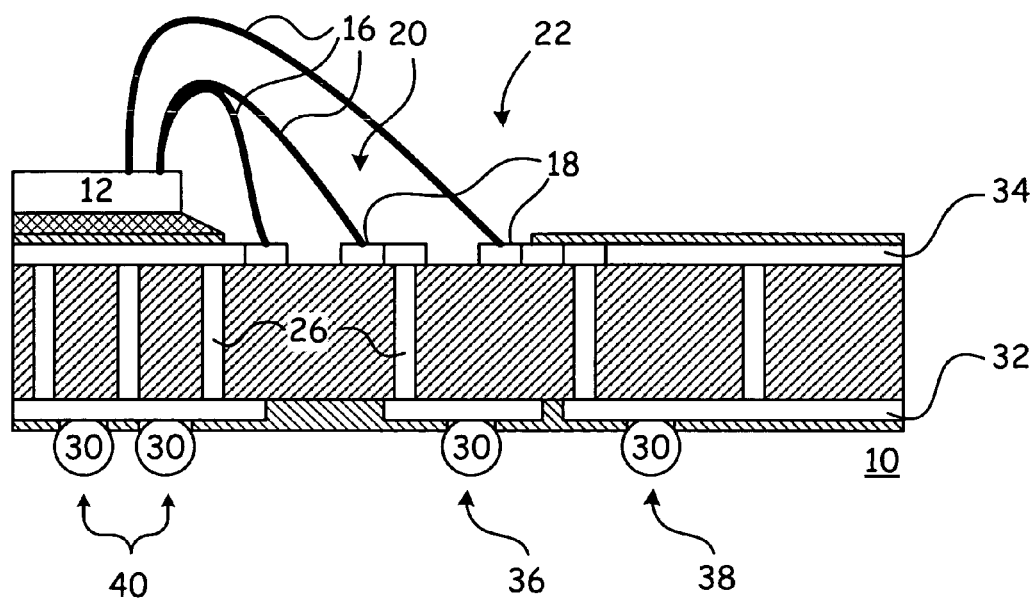
FIG. 2 is a cross sectional view of a package substrate design according to a preferred embodiment of the present invention.

As depicted in FIG. 2, the vias 26 route the signals to contacts, such as solder balls 30, on the opposing side of the package substrate 10. The high speed signals, that are routed on the innermost ring 20 of bond fingers 18, are routed to the innermost group 36 of contacts 30, while the low speed signals are routed to a more peripheral group 38 of contacts 30. This designation of "innermost" is descriptive as between the high speed signal contacts and the low speed signal contacts only. A third group 40 of contacts for power and ground—but not for low speed signals—may be disposed interior to the innermost group 36 of contacts 30 for the high speed signals. Most preferably, the groups 36 and 38 of contacts 30 are disposed in substantially concentric rings.

By routing the high speed signals through the innermost ring 20 of bond fingers 18 and the innermost group 36 of contacts 30, the overall length of the routing for the high speed signals is kept relatively short. This tends to enhance the performance of the package substrate 10 for use with high speed signals. Further, this tends to keep the traces for the high speed signals away from the traces for the low speed signals, as depicted, which tends to reduce the noise that might otherwise be picked up on the high speed signal traces.

Most preferably, all of the signal routing is accomplished on just two layers 32 and 34 of the package substrate 10. Preferably, all of the high speed signals are routed on the bottom layer 32 of the package substrate 10, and all of the low speed signals are routed on the top layer 34 of package substrate 10. It is appreciated that there may be some amount of routing with traces for both the high speed signals and the low speed signals on both of the two layers in some embodiments. However, even in those embodiments, preferably most of the horizontal distance to be covered for each high speed signal trace is traversed on the lower level 32, and most of the horizontal distance to be covered for each low speed signal trace is traversed on the upper level 34.

Most preferably, there are no shielding traces, such as ground traces or power traces, disposed between the signal traces, which tends to increase the signal density of the package substrate 10, because more of the surface area on the routing layers is available for signal traces, and less area of the routing layers is taken up with guard traces. This is made possible, in part, by keeping the shorter high speed signal traces disposed in an interior portion of the package substrate 10 that is generally separate from the longer low speed signal traces disposed in a peripheral portion of the package substrate 10. In some embodiments only the high speed signal traces are not separated by guard traces, but the low speed signal traces are separated by guard traces.

These design features work together to help reduce noise on the high speed signal routing. The high speed signal bond fingers 18 in the inner circle 20 are separated from the low speed signal bond fingers 20 in the outer rows 22. The bonding wires 16 for the high speed signals are separated from the bonding wires 16 for the low speed signals, as seen in FIG. 2. With the bonding wires 16 for the high speed signals physically distanced from the bonding wires 16 for the low speed signals as depicted (different looping profiles), coupling of the electrical signals between the low speed signals and the high speed signals in the bonding wires is reduced. The traces for the high speed signal are on a different layer from the traces for the low speed signals. The routing length for the high speed signals is shorter than the routing length of the low speed signals, with each high speed signal being routed to the nearest contact 30 in the inner portion 36 of the package substrate 10, while the low speed signals are routed to the contacts 30 in the outer portion 38 of the package substrate.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A routing pattern for high speed signals for a package substrate, the routing pattern comprising:

electrically conductive bond fingers on a first surface of the package substrate, where the first surface is adapted to receive an integrated circuit in an attachment zone, the bond fingers disposed in at least two substantially concentric rings around the attachment zone, the bond fingers of an innermost ring of bond fingers all routed to electrically conductive first traces disposed on a first layer of the package substrate, the bond fingers other than those on the innermost ring of bond fingers all routed to electrically conductive second traces disposed on a second layer of the package substrate that is a separate layer from the first layer of the package substrate, the package substrate having electrically conductive traces on only the first layer and the second layer, and electrically conductive contacts disposed on a second surface of the package substrate that substantially opposes the first surface, the first traces all routed to a first set of the contacts that are all disposed within an innermost portion of the second surface, and the second traces all routed to a second set of the contacts that are all disposed within an outermost portion of the second surface.

2. The routing pattern of claim 1, wherein none of the first traces are separated by non signal carrying traces.

3. The routing pattern of claim 1, wherein none of the second traces are separated by non signal carrying traces.

4. The routing pattern of claim 1, wherein a third set of contacts for power and ground only is disposed interior to the first set of contacts on the second surface.

5. The routing pattern of claim 1, wherein the first set of contacts is disposed in a substantially concentric ring on the second surface.

6. The routing pattern of claim 1, wherein the second set of contacts is disposed in at least one substantially concentric ring at a peripheral edge of the second surface.

7. A routing pattern for high speed signals for a package substrate, the routing pattern comprising:

electrically conductive bond fingers on a first surface of the package substrate, where the first surface is adapted to receive an integrated circuit in an attachment zone, the bond fingers disposed in at least two substantially concentric rings around the attachment zone, the bond fingers of an innermost ring of bond fingers all routed to electrically conductive first traces disposed on a first layer of the package substrate, wherein none of the first traces are separated by non signal carrying traces, the bond fingers other than those on the innermost ring of bond fingers all routed to electrically conductive second traces disposed on a second layer of the package substrate that is a separate layer from the first layer of the package substrate, wherein none of the second traces are separated by non signal carrying traces, the package substrate having electrically conductive traces on only the first layer and the second layer, and electrically conductive contacts disposed on a second surface of the package substrate that substantially opposes the first surface, the first traces all routed to a first set of the contacts that are all disposed within an innermost portion of the second surface, and the second traces all routed to a second set of the contacts that are all disposed within an outermost portion of the second surface.

8. The routing pattern of claim 7, wherein a third set of contacts for power and ground only is disposed interior to the first set of contacts on the second surface.

9. The routing pattern of claim 7, wherein the first set of contacts is disposed in a substantially concentric ring on the second surface.

10. The routing pattern of claim 7, wherein the second set of contacts is disposed in at least one substantially concentric ring at a peripheral edge of the second surface.

11. A routing pattern for high speed signals for a package substrate, the routing pattern comprising:

electrically conductive bond fingers on a first surface of the package substrate, where the first surface is adapted to receive an integrated circuit in an attachment zone, the bond fingers disposed in at least two substantially concentric rings around the attachment zone, the bond fingers of an innermost ring of bond fingers all routed to electrically conductive first traces disposed on a first layer of the package substrate, wherein none of the first traces are separated by non signal carrying traces, the bond fingers other than those on the innermost ring of bond fingers all routed to electrically conductive second traces disposed on a second layer of the package substrate that is a separate layer from the first layer of the package substrate, wherein none of the second traces are separated by non signal carrying traces, the package substrate having electrically conductive traces on only the first layer and the second layer, and electrically conductive contacts disposed on a second surface of the package substrate that substantially opposes the first surface, the first traces all routed to a first set of the contacts that are all disposed within an innermost portion of the second surface, where the first set of contacts is disposed in at least one substantially concentric ring, the second traces all routed to a second set of the contacts that are all disposed within an outermost portion of the second surface, where the second set of contacts is disposed in at least one substantially concentric ring at a peripheral edge of the second surface, and a third set of contacts for power and ground only disposed interior to the first set of contacts on the second surface.

12. A packaged integrated circuit, comprising:

an integrated circuit having first bonding pads for high speed signals and second bonding pads for low speed signals, a package substrate having, electrically conductive bond fingers on a first surface of the package substrate, where the first surface is adapted to receive the integrated circuit in an attachment zone, the bond fingers disposed in at least two substantially concentric rings around the attachment zone, the bond fingers of an innermost ring of bond fingers all routed to electrically conductive first traces disposed on a first layer of the package substrate, the bond fingers other than those on the innermost ring of bond fingers all routed to electrically conductive second traces disposed on a second layer of the package substrate that is a separate layer from the first layer of the package substrate, the package substrate having electrically conductive traces on only the first layer and the second layer, and electrically conductive contacts disposed on a second surface of the package substrate that substantially opposes the first surface, the first traces all routed to a first set of the contacts that are all disposed within an innermost portion of the second surface, and the second traces all routed to a second set of the contacts that are all disposed within an outermost portion of the second surface, first wire bonds having a first looping pattern electrically connecting the first bonding pads to the bond fingers of the innermost ring, and second wire bonds having a second looping pattern that is different from the first looping pattern electrically connecting the second bonding pads to the bond fingers other than those on the innermost ring, where the first looping pattern and the second looping pattern are separated by a spacing that reduces coupling between the low speed signals and the high speed signals, and a spacing between the first layer and the second layer reduces coupling between the low speed signals and the high speed signals.

* * * * *